(12) United States Patent
Kamoshida et al.

(10) Patent No.: US 6,194,959 B1
(45) Date of Patent: Feb. 27, 2001

(54) ACTIVE FILTER CIRCUIT

(75) Inventors: Iwao Kamoshida; Mitsumo Kawano, both of Yokosuka (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/516,362

(22) Filed: Mar. 1, 2000

(30) Foreign Application Priority Data

Mar. 11, 1999 (JP) .................................................. 11-064583

(51) Int. Cl.[7] ...................................................... H03K 5/00

(52) U.S. Cl. ........................ 327/552; 327/557; 327/559; 330/306; 330/303

(58) Field of Search .................................... 327/552, 558, 327/559, 553, 557; 330/107, 109, 305, 303, 306

(56) References Cited

U.S. PATENT DOCUMENTS

| | | | |
|---|---|---|---|
| 5,317,217 | * 5/1994 | Rieger et al. | 327/552 |
| 5,912,583 | * 6/1999 | Pierson et al. | 327/553 |

OTHER PUBLICATIONS

Klaas Bult, et al., "A Class of Analog CMOS Circuits Based on the Square–Law Characteristic of an MOS Transistor in Saturation," IEEE Journal of Solid–State Circuits, vol. SC–22, No. 3, (Jun. 1987), pp. 357–364.

* cited by examiner

*Primary Examiner*—Dinh T. Le
(74) *Attorney, Agent, or Firm*—Oblon, Spivak, McClelland, Maier & Neustadt, P.C.

(57) ABSTRACT

A filter circuit includes two current amplifiers and two capacitors constituted of MOS or MIS transistors. An output terminal of the first current amplifier is connected to an input terminal of the second current amplifier, while an output terminal of the second current amplifier is connected to an input terminal of the first current amplifier. One end of the first capacitor is connected to the input terminal of the first current amplifier, while one end of the second capacitor is connected to the output terminal of the first current amplifier the other end thereof is grounded. When an input signal is supplied through the first capacitor, an output signal through a band-pass filter is issued from the output terminal of the first current amplifier, and an output signal through a high-pass filter is issued from the output terminal of the second current amplifier. An output signal through a trap filter or an all-pass filter is also issued by adding the input signal to the output signal of the first current amplifier.

21 Claims, 6 Drawing Sheets

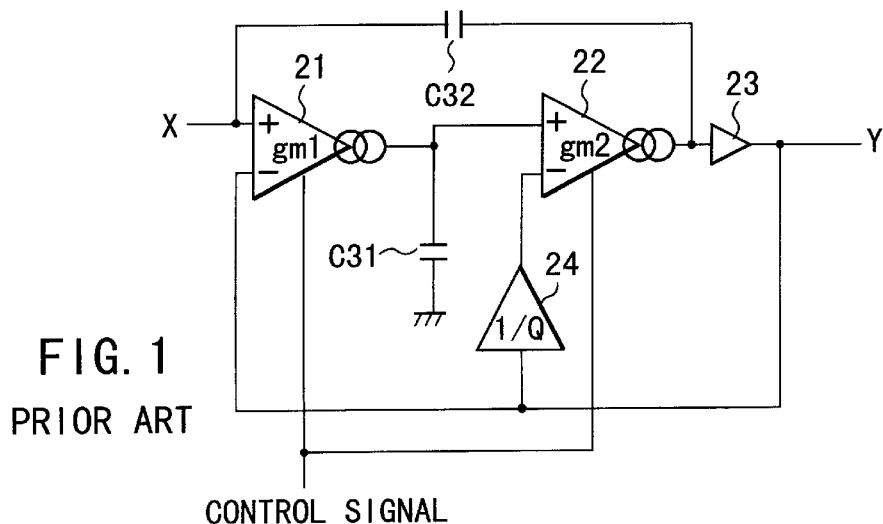
FIG. 1
PRIOR ART
CONTROL SIGNAL
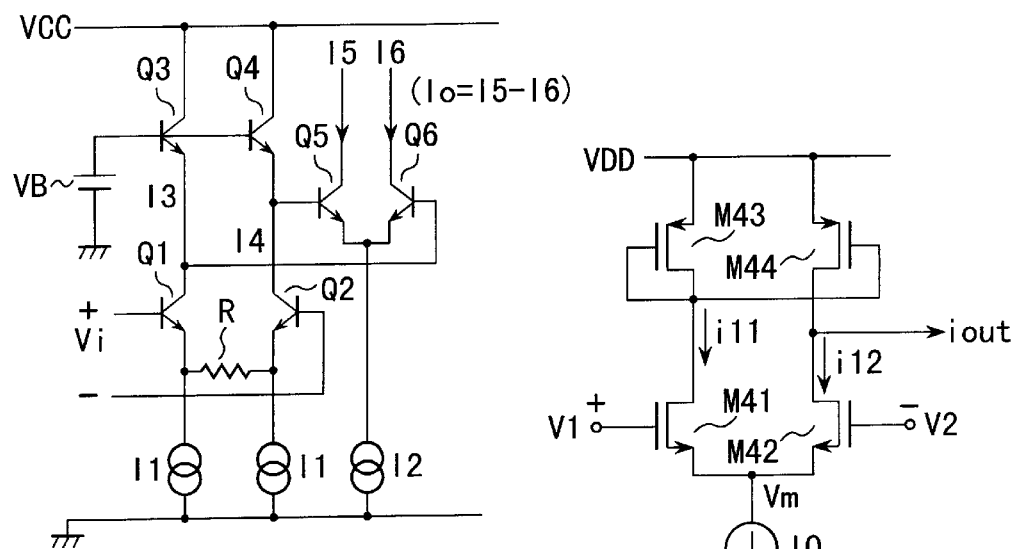
FIG. 2
PRIOR ART
FIG. 3
PRIOR ART

ACTIVE FILTER CIRCUIT

CROSS-REFERENCE TO RELATED APPLICATION

This application is based upon and claims the benefit of priority from the prior Japanese Patent Application No. 11-064583, filed Mar. 11, 1999, the entire contents of which are incorporated herein by reference.

BACKGROUND OF THE INVENTION

The present invention relates to an active filter circuit widely used for analog signal processing and, more particularly, to an active filter circuit applied to a MOS (metal oxide semiconductor) or MIS (metal insulator semiconductor) transistor IC circuit.

A variable GM amplifier constituted of current-output type differential amplifiers has been used as an active filter included in an IC capable of obtaining a desired frequency response. Various types of filter can be formed by applying the above variable GM amplifier to an active filter circuit.

FIG. 1 is a circuit diagram showing an arrangement of a trap filter using prior art GM amplifiers. The trap filter includes variable GM amplifiers 21 and 22. A capacitor C31 is inserted between a ground and a node of an output terminal of the GM amplifier 21 and a noninverting input terminal of the GM amplifier 22. A capacitor C32 is inserted between a noninverting input terminal of the GM amplifier 21 and an output terminal of the GM amplifier 22. The output terminal of the GM amplifier 22 is connected to an inverting input terminal of the GM amplifier 21 through a buffer 23 and to that of the GM amplifier 22 through a buffer circuit 24 for controlling selectivity Q of the filter. The GM amplifiers 21 and 22 are supplied with a control signal in order to obtain a desired frequency response. It is an input signal X of the filter that is supplied to the noninverting input terminal of the GM amplifier 21, while it is an output signal Y of the filter that is output from the GM amplifier 22 through the buffer 23.

In the above arrangement, a transfer function of the output signal Y relative to the input signal X is expressed by the following equation:

$$\frac{Y}{X} = \frac{s^2 + \frac{gm1}{C_{31}} \cdot \frac{gm2}{C_{32}}}{s^2 + \frac{1}{Q}\frac{gm2}{C_{32}}s + \frac{gm1}{C_{31}} \cdot \frac{gm2}{C_{32}}} \quad (1\text{-}1)$$

where s is jω, gm1 and gm2 are transconductances of the GM amplifiers 21 and 22, and $C_{31}$ and $C_{32}$ are capacitances of the capacitors C31 and C32.

As is apparent from the above equation (1-1), a desired frequency response can be obtained by controlling the transconductances gm1 and gm2 of the variable GM amplifiers 21 and 22. For simplification of description, it is assumed that the selectivity Q of the filter is fixed.

FIG. 2 is a circuit diagram of a specific circuit arrangement generally used in the variable GM amplifiers shown in FIG. 1. In this arrangement, the bases of differential pair transistors Q1 and Q2 are a noninverting input and an inverting input, respectively. Transistors Q3 and Q4 whose bases are connected to a voltage source VB, are voltage-to-current converters, the collectors thereof are connected to a power supply Vcc, and the emitters thereof are connected to the collectors of the transistors Q1 and Q2, respectively. The emitters of the transistors Q1 and Q2 are connected to each other via a resistor R for determining a current conversion coefficient, and grounded through their respective constant-current sources of constant current I1.

The bases of transistors Q5 and Q6 of an output control system are connected to their respective collectors of the transistors Q2 and Q1. Both the emitters of the transistors Q5 and Q6 are grounded through a constant-current source of constant current I2. The collectors of the transistors Q5 and Q6 output a differential current.

The circuit shown in FIG. 2 is a basic Gilbert circuit, and a transfer function from input $V_i$ to output current $I_o(=I5-I6)$ is given by the following equation:

$$Io = \frac{1}{R}\frac{I_2}{I_1}V_i \quad (2\text{-}1)$$

where $I_1$ and $I_2$ are values of constant currents I1 and I2 in FIG. 2.

As is evident from the above equation (2-1), the transconductance gm of the circuit illustrated in FIG. 2 is expressed by the following equation:

$$gm = \frac{1}{R}\frac{I_2}{I_1} \quad (3\text{-}1)$$

As is evident from the equation (3-1), the transconductance gm is controlled by a ratio of $I_1$ to $I_2$. It is understood that the frequency response of the filter shown in FIG. 1 is variable if the constant currents I1 and I2 are control signals in the filter circuit while I1 is a fixed current and I2 is a variable current.

The above prior art variable GM amplifiers are so constituted that they compress and expand an input signal and transfer it, making use of diode characteristics of a bipolar transistor. Thus, the prior art amplifiers have the following problem.

Let us consider noise performance first. In the circuit arrangement shown in FIG. 2, an input signal is compressed by a differential circuit constituted of the pairs of transistors Q1 and Q2 and transistors Q3 and Q4 and then expanded by the pair of transistors Q5 and Q6.

The noise dominant over the above circuit is a shot noise of the pair of transistors Q3 and Q4 and that of transistors Q5 and Q6. The shot noise is thus added to the compressed input signal to thereby deteriorate the noise performance. Moreover, noise is caused to such an extent that a thermal noise of in-base resistance (rbb') of each transistor is not negligible.

The following two methods are generally adopted in order to improve the noise performance described above:

(1) The currents I1 and I2 are increased to reduce an input conversion noise. In other words, the I/O dynamic range is increased to improve the S/N ratio equivalently.

(2) The base area of transistors is increased to reduce the in-base resistance rbb' and improve the noise performance.

It is likely that the above two methods will improve the noise performance to some extent, but it is inevitable that they will increase the current consumption. The increase in current requires a transistor of a certain size. In order to lower the in-base resistance rbb', a larger-sized transistor has to be employed. The device size is increased accordingly.

In a commonly-used filter circuit as described above, the noise performance as well as the frequency response required in accordance with its uses is considered to be important. Moreover, the filter circuit is required very strongly to decrease in power consumption and increase in degree of integration in accordance with recent multifunction and high performance of an IC.

Using a prior art variable GM amplifier makes it difficult to improve in filter performance including noise performance, reduce in power consumption, and increase in degree of integration at the same time.

Next, let us consider that a differential amplifier is constituted of MOS or MIS transistors. Using MOS or MIS transistors, both low power consumption and high degree of integration can be expected.

FIG. 3 is a circuit diagram of a generally-used differential amplifier constituted of MOS transistors. In this amplifier, the sources of N-channel MOS transistors M41 and M42 whose gates are supplied with a differential input signal, are grounded through their common constant-current source $I_o$. The sources of P-channel MOS transistors M43 and M44 are connected in common to the power supply, and the drains thereof are connected to their respective drains of the MOS transistors M41 and M42. The gates of the MOS transistors M43 and M44 are connected in common to the drain of the MOS transistor M43 to constitute a current mirror circuit. A current Iout is output from a drain node of the MOS transistors M42 and M44.

In FIG. 3, currents $i_{11}$ and $i_{12}$ are given by the following equations in view of the characteristics of MOS transistors if $V_1$, $V_2$ and $V_m$ are voltages and g is conductance:

$$i_{11} = g(V_1 - V_m - V_{th})^2$$
$$i_{12} = g(V_2 - V_m - V_{th})^2$$

Since $i_{11} + i_{12} = I_o$ (constant current), the output current is expressed by the following equation when $\Delta V = V_1 - V_2$ and $i_{out} = i_{11} - i_{12}$:

$$i_{out} = \sqrt{2gI_o} \cdot \Delta V \cdot \sqrt{1 - \frac{g}{2I_o} \Delta V} \tag{4-1}$$

As is seen from the equation (4-1), the output current $i_{out}$ is not made linear relative to an input $\Delta V$ but caused to have a second-order distortion. Consequently, even though a filter circuit includes a differential amplifier constituted of MOS or MIS transistors, a distortion easily occurs and thus any measures have to be taken.

BRIEF SUMMARY OF THE INVENTION

The present invention has been developed in consideration of the above situation and its object is to provide an active filter circuit which is smaller in size than a prior art filter circuit constituted of differential amplifiers and suitable for a MOS or MIS transistor circuit and also which is decreased in distortion and improved in noise performance.

In order to attain the above object, an active filter circuit according to one aspect of the present invention comprises:

a first current amplifier having a MIS transistor circuit arrangement, the first current amplifier including a first input terminal, a first output terminal, and at least one first control terminal for controlling transconductance thereof;

a first capacitor one electrode of which is connected to the first input terminal of the first current amplifier;

a second current amplifier having a MIS transistor circuit arrangement, the second current amplifier including a second input terminal, a second output terminal, and at least one second control terminal for controlling transconductance thereof, the second input terminal being connected to the first output terminal thereof, and the second output terminal being connected to the first input terminal of the first current amplifier; and a second capacitor one electrode of which is connected to a node between the first output terminal and the second input terminal.

The active filter circuit of the present invention further comprises:

a third current amplifier having a MIS transistor circuit arrangement, the third current amplifier including a third input terminal, a third output terminal, and at least one third control terminal for controlling transconductance thereof, the third input terminal and the third output terminal being connected to the first output terminal of the first current amplifier; and a fourth current amplifier having a MIS transistor circuit arrangement, the fourth current amplifier including a fourth input terminal, a fourth output terminal, and at least one fourth control terminal for controlling transconductance thereof, the fourth output terminal being connected to the second output terminal of the second current amplifier.

According to the active filter circuit of the present invention described above, a current amplifier having a MIS transistor circuit arrangement includes one input terminal and one output terminal and does not have a differential amplifier arrangement which repeats compression and expansion. The active filter circuit is thus resistant to noise since it transfers a signal using an impedance obtained from the property of MIS transistors with fewer elements.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram of a trap filter using a prior art GM amplifier constituted of current-output type differential amplifiers;

FIG. 2 is a circuit diagram of a specific circuit generally used in the variable GM amplifier shown in FIG. 1;

FIG. 3 is a circuit diagram of a generally-used differential amplifier constituted of MOS transistors;

DETAILED DESCRIPTION OF THE INVENTION

Embodiments of the present invention will now be described with reference to the accompanying drawings.
(First Embodiment)

Figure 4:
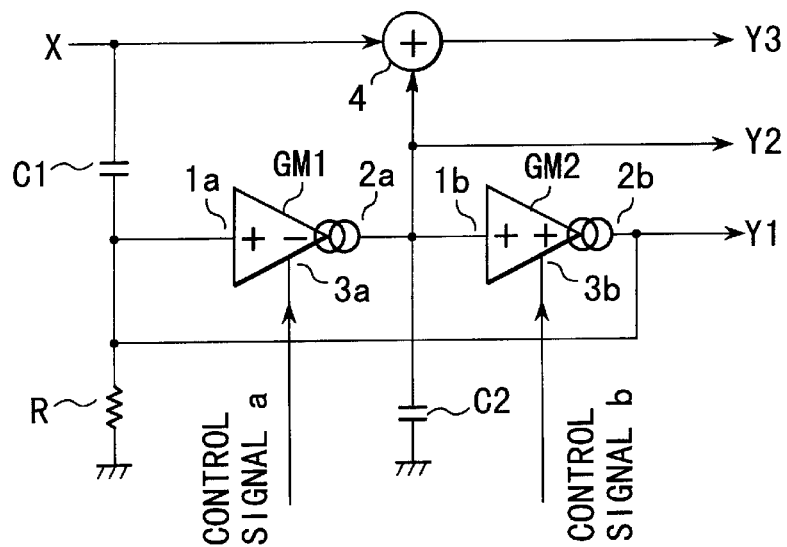
FIG. 4 is a circuit diagram of an active filter according to a first embodiment of the present invention.

FIG. 4 is a circuit diagram showing an arrangement of an active filter according to a first embodiment of the present invention. A current amplifier GM1 is a simple inverting amplifier constituted of a MOS transistor circuit. The amplifier GM1 includes one input terminal 1a, one output terminal 2a and another terminal 3a supplied with a control signal a for controlling transconductance thereof. One electrode of a capacitor C1 is connected to the input terminal 1a of the current amplifier GM1.

A current amplifier GM2 is a simple noninverting amplifier constituted of a MOS transistor circuit. The amplifier GM2 includes one input terminal 1b, one output terminal 2b and another terminal 3b supplied with a control signal b for controlling transconductance thereof. The input terminal 1b of the current amplifier GM2 is connected to the output terminal 2a of the current amplifier GM1. The output terminal 2b of the current amplifier GM2 is connected to the input terminal 1a of the current amplifier GM1. One electrode of a capacitor C2 is connected to a node between the input terminal 1b of the current amplifier GM2 and the output terminal 2a of the current amplifier GM1.

A resistor R is inserted between the input terminal 1a of the current amplifier GM1 and a ground. An input signal X of the filter is supplied to both the other electrode of the capacitor C1 and an adding circuit 4. The adding circuit 4 is constituted of one or more MOS transistors and has a function of adding the input signal X to an output signal of the output terminal 2a of the current amplifier GM1.

An output signal Y1 of the filter is issued from the output terminal 2b of the current amplifier GM2, an output signal Y2 thereof is generated from the output terminal 2a of the current amplifier GM1, and an output signal Y3 thereof is issued as an adding output of the adding circuit 4.

The following are transfer functions of the output signals Y1, Y2 and Y3 relative to the input signal X:

$$\frac{Y1}{X} = \frac{s^2}{s^2 + \frac{1}{C_1 R}s + \frac{gm1}{C_1} \cdot \frac{gm2}{C_2}} \quad (5\text{-}1)$$

$$\frac{Y2}{X} = \frac{\frac{gm1}{C_2}s}{s^2 + \frac{1}{C_1 R}s + \frac{gm1}{C_1} \cdot \frac{gm2}{C_2}} \quad (5\text{-}2)$$

$$\frac{Y3}{X} = \frac{s^2 + \frac{1}{C_1 R}s - \frac{gm1}{C_2}s + \frac{gm1}{C_1} \cdot \frac{gm2}{C_2}}{s^2 + \frac{1}{C_1 R}s + \frac{gm1}{C_1} \cdot \frac{gm1}{C_2}} \quad (5\text{-}3)$$

where s is jω, gm1 and gm2 are transconductances of the current amplifiers GM1 and GM2, R is a value of the resistor R, and $C_1$ and $C_2$ are capacitances of the capacitors C1 and C2.

The above equation (5-1) is directed to a high-pass filter (HPF), while the equation (5-2) represents a band-pass filter (BPF). The equation (5-3) represents a trap filter or an all-pass filter (APF) depending on the conditions.

According to the circuit arrangement shown in FIG. 4, by varying the transconductances gm1 and gm2 in response to the control signals a and b, the above transfer functions can be varied to obtain a desired frequency response.

The filter circuit of FIG. 4 can be constituted using a prior art differential amplifier; however, the elements are increased in number and the circuit is inevitably increased in size. In other words, since the circuit is originally supplied with a differential signal, it is necessary to fix a noninverting signal or an inverting signal to a certain reference voltage to operate the circuit in response to substantially a non-differential signal. Since, in this case, an additional reference voltage source is needed, the circuit size is increased inevitably. Furthermore, noise of the reference voltage source affects the noise performance of the filter and thus the filter should be designed carefully.

The above disadvantage is overcome by the circuit arrangement of the present invention including the current amplifiers GM1 and GM2 using MOS transistors. Hereinafter such an arrangement will be described in detail.

Figure 5:
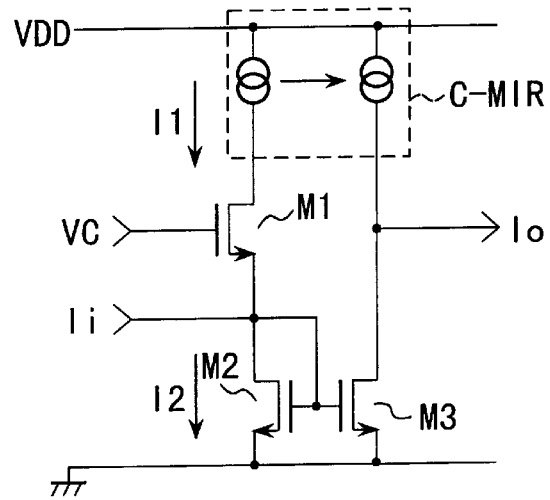
FIG. 5 is a circuit diagram illustrating a specific arrangement of a first current amplifier (inverting amplifier) of the active filter shown in FIG. 4.

FIG. 5 is a circuit diagram specifically showing an arrangement of the current amplifier GM1 of FIG. 4 as a current inverting circuit. Two N-channel MOS transistors M2 and M3 whose sources are grounded, have a common gate. A conventional current mirror circuit C-MIR connected to a power supply VDD supplies a drain current to the MOS transistors M2 and M3. A MOS transistor M1 is connected in series to a drain current path of the MOS transistor M2. A control signal VC (gate control voltage VC) for controlling transconductance of the current amplifier GM1 is supplied to the gate of the MOS transistor M1. An input current Ii is supplied to the drain and common gate of the MOS transistor M2, and an output current $I_o$ is obtained from the drain of the MOS transistor M3.

In the above arrangement, the input current Ii is inverted by both an NMOS current mirror circuit constituted of the transistors M2 and M3 and the conventional current mirror circuit C-MIR and obtained as the output current $I_o$. The input impedance of the circuit depends upon the MOS transistors M2 and M3. The input current Ii will thus be described below using the following equations:

$$I2 = Ii + I1 \quad (6\text{-}1)$$

$$I1 = k(Vgs_1 - V_t)^2 \quad (6\text{-}2)$$

$$I2 = k(Vgs_2 - V_t)^2 \quad (6\text{-}3)$$

$$Vgs_2 + Vgs_1 = VC \quad (6\text{-}4)$$

where k is a constant which is proportionate to the ratio of gate width W to gate length L of each of the MOS transistors M1 and M2, $Vgs_1$ and $Vgs_2$ are gate-to-source voltages of the MOS transistors M1 and M2, $V_t$ is a threshold voltage of each of the MOS transistors, and VC is a gate control voltage of the MOS transistor M1.

Ii is derived from the above equations (6-1), (6-2) and (6-3):

$$Ii = k(Vgs_2 - Vgs_1)(Vgs_2 + Vgs_1 - 2V_t) \tag{7-1}$$

Ii is thus derived from the equations (6-4) and (7-1):

$$Ii = k(2Vgs_2 - VC)(VC - 2V_t) \tag{8-1}$$

Moreover, $Vgs_2$ is obtained from the equation (8-1) as follows:

$$Vgs_2 = \frac{VC}{2} + \frac{Ii}{2k(VC - 2V_t)} \tag{9-1}$$

The input impedance Zi of the current inverting circuit shown in FIG. 5 can thus be expressed by the following equation:

$$Zi = \frac{1}{2k(VC - 2V_t)} \tag{10-1}$$

It is clearly understood from the equation (10-1) that the input impedance of the current inverting circuit shown in FIG. 5 is controlled by the control voltage VC. The resistor R shown in FIG. 4 can thus be replaced with the input impedance of the current inverting circuit. Since, moreover, the current output $I_o$ is obtained by connecting the drain of the transistor M3 and the output node of the current mirror circuit C-MIR, the $I_o$ source has a sufficient high impedance to serve as an output of the current amplifier GM1.

Figure 6:
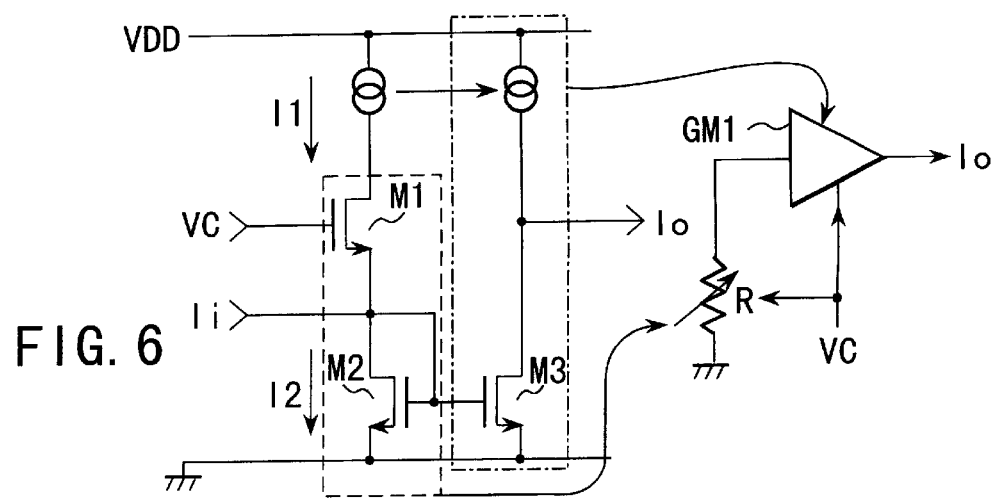
FIG. 6 is a conceptual diagram showing a correlation of part of the active filter in FIG. 4 with the first current amplifier in FIG. 5.

If the current inverting circuit of FIG. 5 is replaced with an ideal symbol, the conceptual diagram thereof is obtained as shown in FIG. 6. It is thus evident that the circuit shown in FIG. 5 includes the resistor R and current amplifier GM1 of FIG. 4 and the resistor R is varied in value by the control voltage VC (corresponding to the control signal a of FIG. 4).

Figure 7:
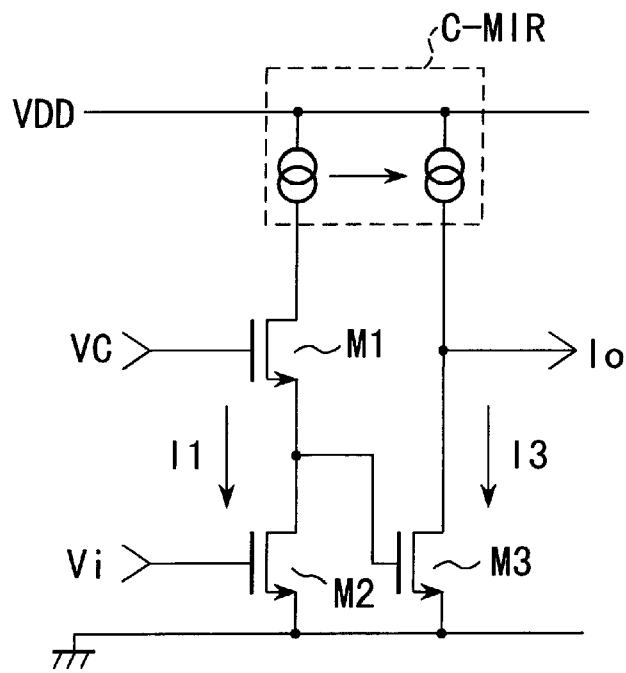
FIG. 7 is a circuit diagram illustrating a specific arrangement of a second current amplifier (noninverting amplifier) of the active filter shown in FIG. 4.

FIG. 7 is a circuit diagram specifically showing an arrangement of the current amplifier GM2 of FIG. 4 as a voltage-to-current converter circuit. Since this circuit includes the same elements as those of FIG. 5, they are denoted by the same reference numerals and symbols. FIG. 7 differs from FIG. 5 in circuit connection. In FIG. 7, the gate of a MOS transistor M3 is connected to the drain of a MOS transistor M2, and an input voltage Vi is applied to the gate of the MOS transistor M2. In other words, a signal input to the gate of the MOS transistor M2 is inverted, and the inverted signal is supplied to the gate of the MOS transistor M3. The output current $I_o$ corresponds to a difference between drain currents I1 and I3 of the MOS transistors M2 and M3.

The transconductance of the circuit shown in FIG. 7 will now be described using equations. First the currents I2 and I3 are given by the following equations. These equations conform to those related to FIG. 5. $Vgs_3$ represents a gate-to-source voltage of the MOS transistor M3.

$$I1 = k(Vgs_1 - V_t)^2 = k(Vi - V_t)^2 \tag{11-1}$$

$$I3 = k(Vgs_3 - V_t)^2 \tag{11-2}$$

$Vgs_3$ is expressed as follows:

$$Vgs_3 = VC - Vgs_1 \tag{12-1}$$

I3 is derived from the above equations (11-1), (11-2) and (12-1) as follows:

$$I3 = k(VC - Vi - V_t)^2 \tag{13-1}$$

The output current $I_o$ is thus given by the following equation:

$$Io = I1 - I3 = -k(VC - 2V_t)(VC - 2Vi) \tag{14-1}$$

By differentiating the equation (14-1) with the control voltage VC, the transconductance gm of the voltage-to-current converter circuit of FIG. 7 is expressed as:

$$gm = -k(VC - 2V_t) \tag{15-1}$$

It is seen from the equation (15-1) that the transconductance gm can be controlled by the control voltage VC. The control voltage VC corresponds to a control signal b of the current amplifier GM2.

Figure 8:
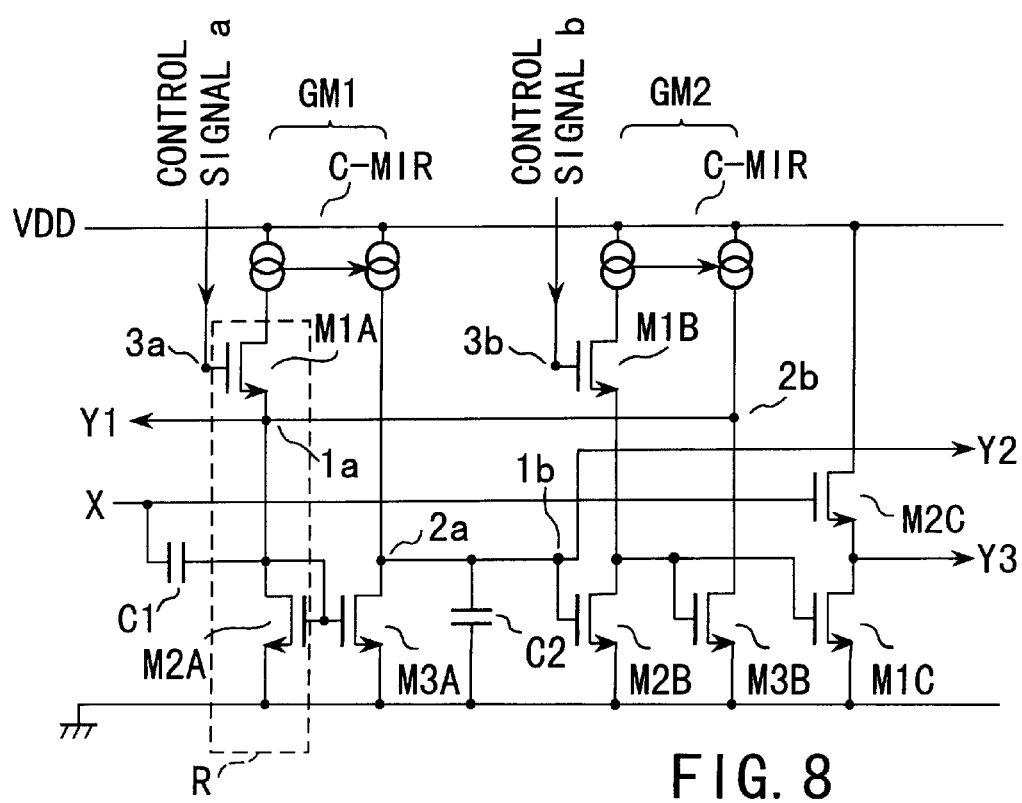
FIG. 8 is a circuit diagram specifically showing the active filter of FIG. 4 to which the first and second current amplifiers of FIGS. 5 and 7 are applied.

FIG. 8 is a circuit diagram specifically showing an active filter in which the two circuit arrangements of FIGS. 5 and 7 are applied to the current amplifiers GM1 and GM2 of FIG. 4. In FIG. 8, M1A to M3A indicate MOS transistors corresponding to the MOS transistors M1 to M3 of FIG. 5, and M1B to M3B denote MOS transistors corresponding to the MOS transistors M1 to M3 of FIG. 7. Control signals a and b corresponding to the control voltage VC are supplied to the gates of the transistors M1A and M1B, respectively. FIG. 8 shows nodes corresponding to the input terminal 1a, output terminal 2a and control signal terminal 3a of the current amplifier GM1 and nodes corresponding to the input terminal 1b, output terminal 2b and control signal terminal 3b of the current amplifier GM2. FIG. 8 also shows an equivalent for the resistor R which has been described above with reference to FIG. 6.

N-channel MOS transistors M1C and M2C connected in series between a power supply VDD and a ground, constitute an adder circuit 4. An input signal X is output as an output signal Y3 through a source follower constituted of transistors M2C and M1C. An inverted signal of an output signal Y2 output from the source of the transistor M1B is voltage-to-current-converted by the transistor M1C.

In other words, the inverted signal of the output signal Y2 is voltage-converted using the transistor M2C as a load. A conversion value Y3g of the output signal Y2 then depends upon the ratio of gate width W to gate length L of each of the transistors M2C and M1C. This value is expressed as:

$$Y3g = Y2 \cdot \sqrt{\frac{(W/L)_{M2C}}{(W/L)_{M1C}}} \tag{16-1}$$

Consequently, the output signal Y3 is an addition of the input signal X and the signal expressed by the equation (16-1). The adder circuit 4 can be constituted of the two transistors M1C and M2C very simply, which contributes to a reduction in element size.

The filter circuit of the first embodiment is constituted of MOS transistors without using any differential amplifier and thus its constituting elements can be decreased to almost one-half those of a current amplifier formed by a conventional bipolar technique.

Furthermore, as is evident from the above equations (8-1) and (13-1), a signal is transferred using the impedance acquired from the property of MOS transistors, without repeating compression and expansion of the signal as in the prior art. Such an arrangement of the filter circuit improves the noise performance and so does a 50 percent reduction in elements.

As a specific application of the present invention, the filter shown in FIG. 8 is employed as a trap filter. First, let us consider the transfer function again. If the output signal Y3 is used as an output of the trap filter, the following equation has only to be satisfied with respect to the numerator of the above equation (5-3):

$$\frac{1}{C_1 R} = \frac{gm1}{C_2} \quad (17\text{-}1)$$

Considering a relative error of the elements, the capacitors C1 and C2 of the equation (17-1) are set to have the same capacity. The following relationship is then established between R and gm1:

$$\frac{1}{R} = gm1 \quad (18\text{-}1)$$

Figure 9:
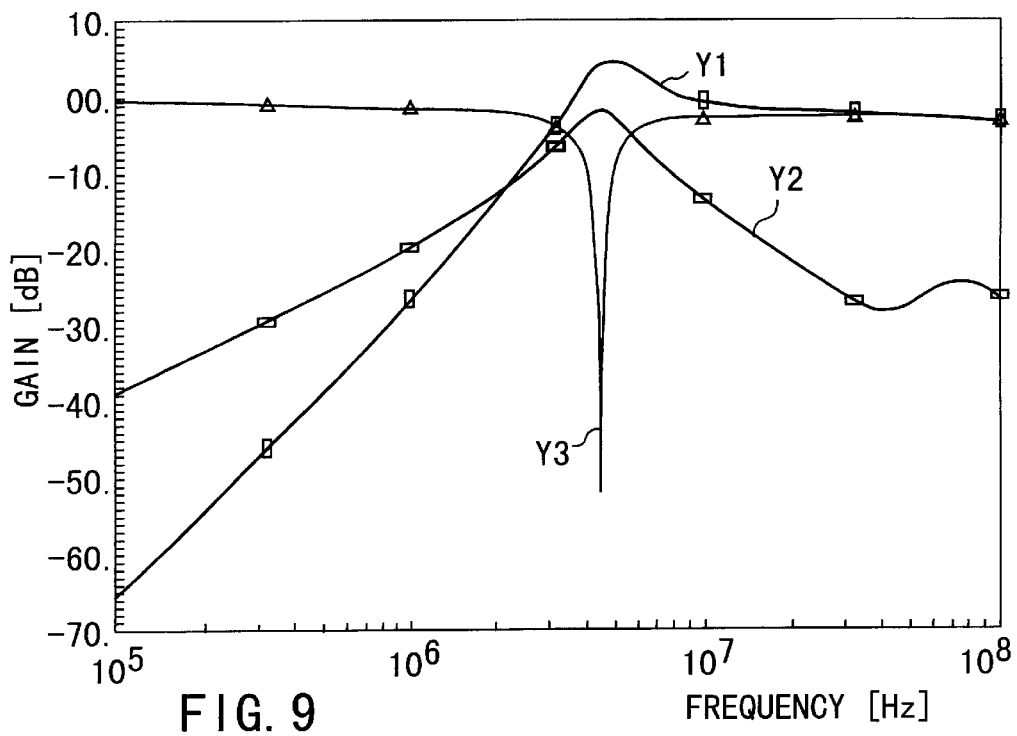
FIG. 9 is a diagram of simulated gain-frequency characteristics of a color signal trap filter to which the active filter shown in FIG. 4 is applied.

FIG. 9 is a diagram of characteristic curves showing simulation results of a color signal trap filter designed in consideration of the above relations and used for luminance signal processing of TV video signals. In FIG. 9, Y3 indicates a sharp trap characteristic.

Figure 10:
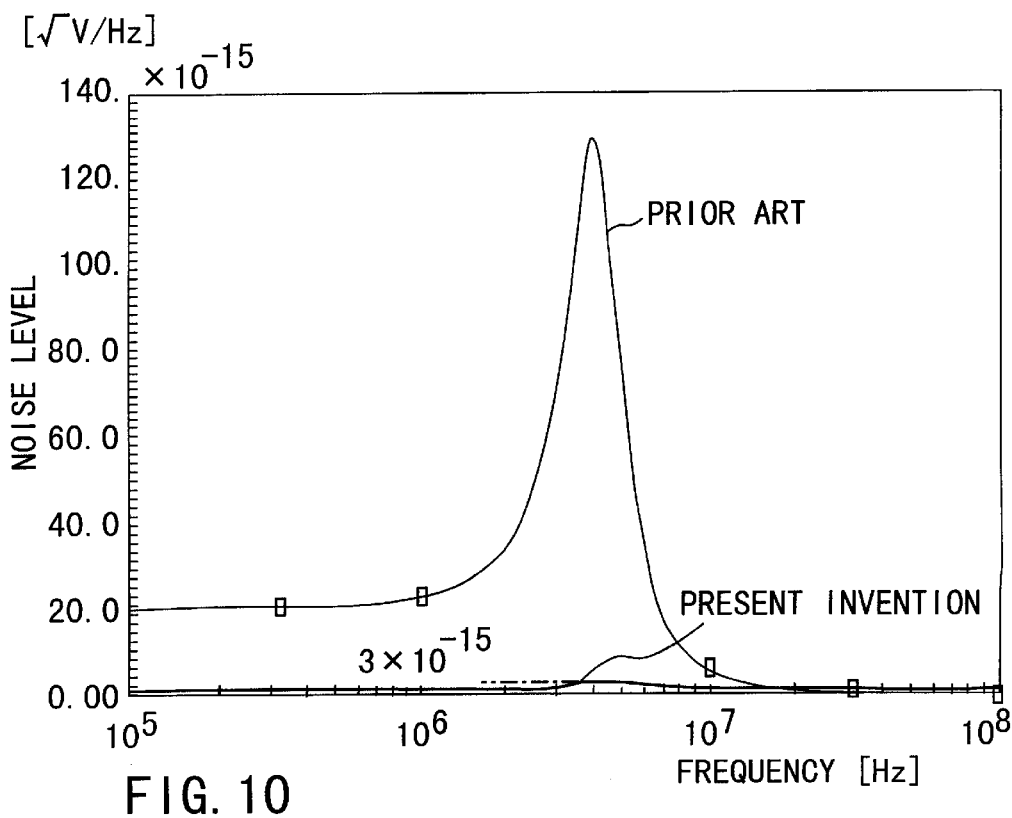
FIG. 10 is a diagram of noise frequency characteristics between the prior art filter and the active filter shown in FIG. 4.

FIG. 10 is a diagram of characteristic curves indicating noise frequency characteristics of the prior art trap filter shown in FIG. 1 and those of the present invention. The trap frequency corresponds to a color signal frequency of 4.43 MHz in the PAL system. As is apparent from FIG. 10, the filter of the present invention is superior in noise performance to the prior art trap filter. The in-band noise performance is improved about 10 dB as compared with that of the prior art filter.

On the other hand, since the present invention is directed to an impedance (conductance) variable filter using the property of MOS transistors, its current consumption can be decreased and so can be its power consumption. In the case of the color signal trap filter of 4.43 MHz, the prior art consumes current of about 700 µA, while the present invention consumes current of about 100 µA which is ⅐ that of the prior art.

According to the first embodiment, a technique of simultaneously reducing in element size and improving in noise performance can be achieved. More specifically, by applying a variable current amplifier using MOS transistors without any differential amplifier, there can be provided a filter circuit capable of reducing in circuit size, decreasing in power consumption, and improving in noise performance.

(Second Embodiment)

Figure 11:
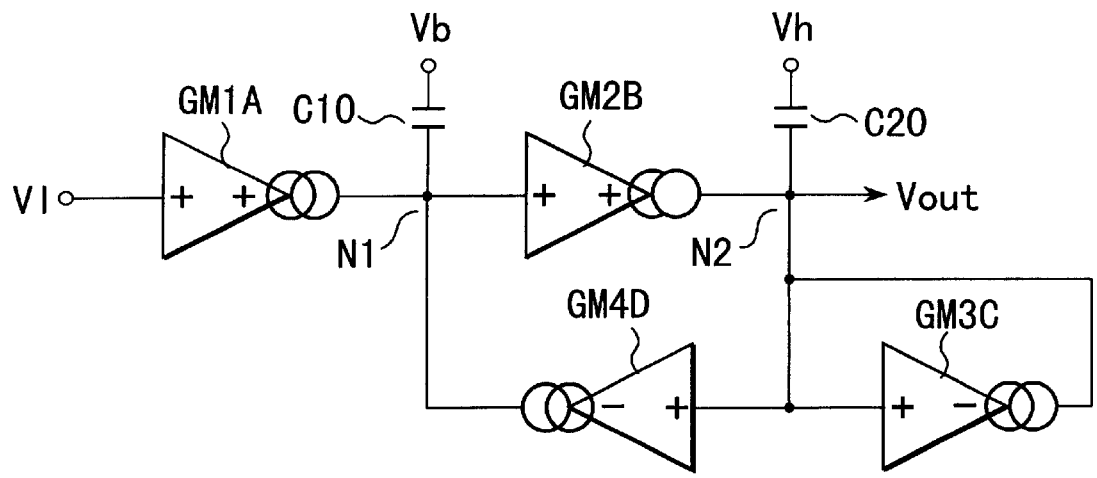
FIG. 11 is a circuit diagram of an active filter according to a second embodiment of the present invention.

FIG. 11 is a circuit diagram showing an arrangement of an active filter according to a second embodiment of the present invention. In this filter, an output terminal of a current amplifier GM1A, an input terminal of a current amplifier GM2B, and an output terminal of a current amplifier GM4D are connected together at a node N1. An output terminal of the current amplifier GM2B, input and output terminals of a current amplifier GM3C, and an input terminal of the current amplifier GM4D are connected together at a node N2. One end of a capacitor C10 is connected to the node N1, and the other end of the capacitor C10 is supplied with an input signal $V_b$. One end of a capacitor C20 is connected to the node N2, and the other end of the capacitor C20 is supplied with an input signal $V_h$. An input terminal of the current amplifier GM1A is supplied with an input signal $V_l$, and the output terminal (node N2) of the current amplifier GM2B is connected to an output terminal Vout of the filter.

Each of the above current amplifiers is constituted of a MOS transistor circuit and provided with one input terminal and one output terminal. Each current amplifier is also provided with a terminal (not shown) for controlling transconductance of the filter. In the second embodiment, the current amplifiers GM1A and GM2B are noninverting amplifiers, and the current amplifiers GM3C and GM4D are inverting amplifiers.

The foregoing active filter serves as a multipurpose filter. An LPF (low-pass filter) signal is output from the output terminal Vout in response to the input signal $V_l$, a BPF (band-pass filter) signal is output from the output terminal Vout in response to the input signal $V_b$, and an HPF (high-pass filter) signal is output from the output terminal Vout in response to the input signal $V_h$ (For example, the current amplifier GM1A is deleted if the filter serves as only the BPF and HPF). Furthermore, the current amplifier GM4D can be replaced with a noninverting amplifier and the current amplifier GM2B can be replaced with an inverting amplifier. The amplifier GM3C has to be an inverting amplifier. The amplifier GM1A can be replaced with an inverting amplifier.

The output terminal voltage Vn1 of the current amplifier GM1A and the output terminal voltage Vout of the filter can be expressed by the following equations:

$$Vn1 = V_b + \frac{1}{sC_1}(gm1 \cdot V_1 - gm4 \cdot Vout) \quad (19\text{-}1)$$

$$Vout = V_h + \frac{1}{sC_2}(gm2 \cdot Vn1 - gm3 \cdot Vout) \quad (19\text{-}2)$$

where s is jω, gm1 to gm4 are transconductances of the current amplifiers GM1A, GM2B, GM3C and GM4D, and $C_1$ and $C_2$ are capacitances of the capacitors C10 and C20.

Based on the above equations (19-1) and (19-2), Vout can also be expressed as:

$$Vout = \frac{\frac{gm1}{gm4}V_1 - \frac{sC_2}{gm4}V_b + \frac{s^2 C_1 C_2}{gm2 \cdot gm4}V_h}{\frac{s^2 C_1 C_2}{gm2 \cdot gm4} + \frac{sC_2 gm3}{gm2 \cdot gm4} + 1} \quad (20\text{-}1)$$

If gm1=gm2=gm4, gm3=m·gm1, $C_1=C_2$, and ω0=gm1/$C_1$, the following equation is obtained:

$$Vout = \frac{V_1 + \left(\frac{s}{w_0}\right)V_b + \left(\frac{s}{w_0}\right)^2 V_h}{\left(\frac{s}{w_0}\right)^2 + m\left(\frac{s}{w_0}\right) + 1} \quad (21\text{-}1)$$

Consequently, the current amplifiers GM1A, GM2B, GM3C and GM4D, none of which are differential amplifiers, and the capacitors C1 and C2 can produce second-order filter characteristics of the LPF, BPF and HPF corresponding to the input signals $V_l$, $V_b$ and $V_h$.

Figure 12:
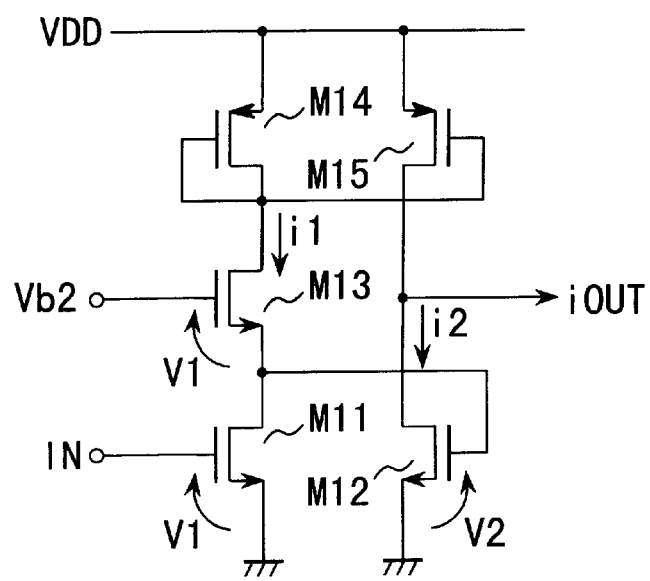
FIG. 12 is a circuit diagram of a specific arrangement of a current amplifier (noninverting amplifier) in the active filter shown in FIG. 11.

FIG. 12 is a circuit diagram specifically showing an arrangement of noninverting amplifiers used for the current amplifiers GM1A and GM2B illustrated in FIG. 11. An input voltage V1 of an input terminal IN is applied to the gate of an N-channel MOS transistor M11 whose source is grounded. An N-channel MOS transistor M13 is cascade-connected to the drain side of the N-channel MOS transistor M11, and its drain current $i_1$ is output through a current mirror circuit constituted of P-channel MOS transistors M14 and M15 whose sources are connected to a power supply VDD. The MOS transistors M11 and M13 constitute an inverting circuit, and its output V2 is input to the gate of an N-channel MOS transistor M12 whose source is grounded. The drain current $i_2$ of the transistor M12 is output as $-i_2$. The output current iout is thus equal to $i_1-i_2$ (iout=$i_1-i_2$).

If the MOS transistors M11 and M13 are built in the same size, idealistically, the output V2 is equal to Vb2−V1 (V2= Vb2−V1). Assuming that a bias voltage of V1 is Vb, an alternating current thereof is $\upsilon_1$, a control voltage Vb2 applied to the gate of the transistor M13 is 2Vb, V1=Vb+$\upsilon_1$ and V2=Vb−$\upsilon_1$. The output current, iout=i1−i2, is thus given as follows by the characteristics of the MOS transistors:

$$i_1 = g(V1-Vth)^2$$

$$i_2 = g(V2-Vth)^2$$

where g is transconductance and Vth is a threshold voltage of the MOS transistors. The output current iout is thus expressed as follows:

$$iout = g\{(Vb+\upsilon_1 - Vth)^2 - (Vb-\upsilon_1 - Vth)^2\}$$

$$= 4g(Vb-Vth)\cdot\upsilon_1.$$

The above equation indicates that the output current iout is linear with respect to the input $\upsilon_1$ and has no distortion.

Figure 13:
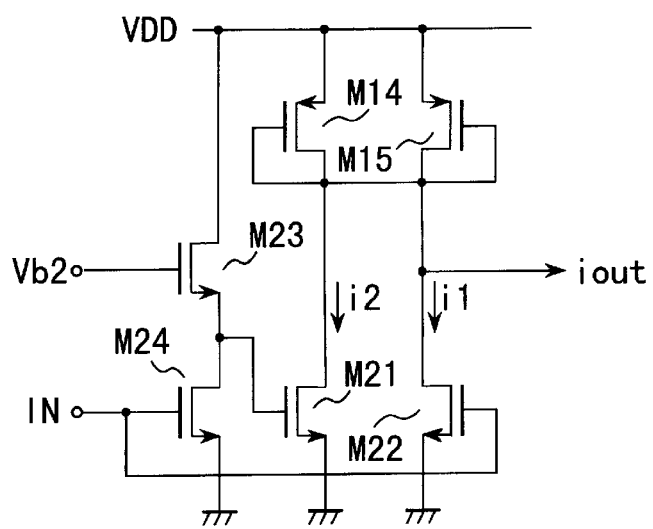
FIG. 13 is a circuit diagram illustrating a specific arrangement of a current amplifier (inverting amplifier) of the active filter shown in FIG. 11.

FIG. 13 is a circuit diagram specifically showing an arrangement of inverting amplifiers used for the current amplifiers GM3C and GM4D illustrated in FIG. 11. Like in FIG. 12, this arrangement includes transistors M21 and M22 whose sources are grounded, transistors M14 and M15 constituting a current mirror circuit, and N-channel MOS transistors M23 and M24 constituting a noninverting circuit. A control voltage Vb2 is applied to the gate of the transistor M23. The gate of the transistor M24 is connected to an input terminal IN and the gate of the transistor M22. An output of a node between the transistors M23 and M24 is applied to the gate of the transistor M21. In other words, the drain currents $i_1$ and $i_2$ in the circuit arrangement of FIG. 12 are replaced with each other, and the output current iout'=$i_2$−$i_1$=−iout.

The gain of the current amplifiers shown in FIGS. 12 and 13 can be set by controlling the coefficient g since the coefficient is varied almost in proportion to the gate width. The present invention is not limited to the above circuit arrangements. The noninverting and inverting current amplifiers can be constituted of the same amplifiers if an inverter is added to either of them.

Figure 14:
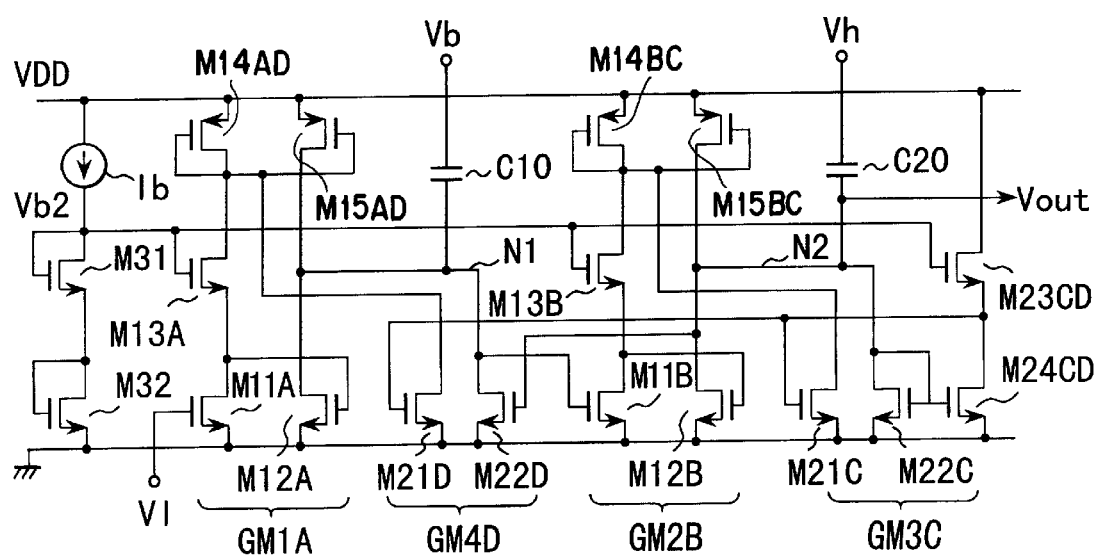
FIG. 14 is a circuit diagram specifically showing a filter circuit to which both the current amplifiers of FIGS. 12 and 13 are applied.

FIG. 14 is a circuit diagram specifically showing an active filter in which the two circuit arrangements of FIGS. 12 and 13 are applied to the current amplifiers GM1A, GM2B, GM3C and GM4D of FIG. 11. In FIG. 14, the circuits of the current amplifiers GM1A and GM2B of FIG. 11, using noninverting amplifiers, are distinguished by adding "A" and "B" to the reference numbers of the MOS transistors described in FIG. 12, while the circuits of the current amplifiers GM3C and GM4D of FIG. 11, using inverting amplifiers, are distinguished by adding "C" and "D" to the reference numbers of the MOS transistors described in FIG. 13.

In the circuit shown in FIG. 14, the current amplifiers GM1A and GM4D are connected to the same capacitor C10 and thus have a current mirror circuit in common. The transistors constituting the current mirror circuit are therefore denoted as M14AD and M15AD. The current amplifiers GM2B and GM3C are connected to the same capacitor C20 and thus have a current mirror circuit in common. The transistors constituting the current mirror circuit are therefore denoted as M14BC and M15BC. Since the current amplifiers GM3C and GM4D have the inverting circuits M23 and M24 of FIG. 13 in common, the transistors constituting the inverting circuits are denoted as M23CD and M24CD.

Furthermore, N-channel MOS transistors M31 and M32, which are diode-connected to a current source Ib, are connected in series between the power supply VDD and the ground to constitute a bias circuit. In other words, a voltage Vb2 for controlling transconductance of each current amplifier is output from a node of the output of the current source Ib and the drain and gate of the MOS transistor M31.

The circuit shown in FIG. 14 has the following characteristic.

When the gain of each of pairs of transistors M11A and M13A, transistors M11B and M13B, and transistors M23CD and M24CD, constituting an inverting circuit, is shifted from −1, the outputs are applied to the gates of the transistors M12A, M12B, M21D and M21C. Since a shift of drain currents of the transistors M21D and M21C is subtracted from that of drain currents of the transistors M12A and M12B by the function of each current mirror, the shift of drain currents (DC shift) is canceled, with the result that the DC voltage shift is restrained. However, when the selectivity Q of the filter is set to a value other than 1, the size of the transistor M21C is varied and an amount of cancellation is reduced. Even in view of this, the circuit of the present invention is well-balanced with respect to a direct current.

The MOS transistors of the second embodiment can constitute a second-order active filter which decreases in distortion and inhibits elements from increasing in number. In other words, the device size can be decreased and the noise performance can be improved at the same time by applying a variable current amplifier using MOS transistors constituted of no differential amplifiers.

The foregoing embodiments are directed to the use of MOS transistors. However, the present invention can be applied to a MIS transistor using various types of insulator as well as oxide for a gate insulation film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An active filter circuit comprising:
   a first current amplifier comprising a first MIS transistor circuit arrangement, the first current amplifier including a first input terminal, a first output terminal, and at least one first control terminal configured to control a first current amplifier transconductance;
   a first capacitor connected at one first capacitor electrode to the first input terminal of the first current amplifier;
   a second current amplifier comprising a second MIS transistor circuit arrangement, the second current amplifier including a second input terminal, a second output terminal, and at least one second control terminal configured to control a second current amplifier transconductance, the second input terminal connected to the first output terminal of the first current amplifier, and the second output terminal connected by a DC conductor to the first input terminal of the first current amplifier; and
   a second capacitor connected at one second capacitor electrode to a node between the first output terminal and the second input terminal;

wherein, when an input signal is input to the other terminal of the first capacitor, an output signal corresponding to the input signal filtered through a band-pass filter is obtained from the first output terminal of the first current amplifier and an output signal corresponding to the input signal filtered through a high-pass filter is obtained from the second output terminal of the second current amplifier.

2. The active filter circuit according to claim 1, wherein the first current amplifier includes a resistor circuit comprising at least one MIS transistor between the first input terminal and a ground level.

3. The active filter circuit according to claim 1, wherein the first current amplifier comprises a current inverting circuit.

4. The active filter circuit according to claim 3, wherein the current inverting circuit includes:
   a first MIS transistor having a first gate, a first source, and a first drain, the first source connected to a ground level;
   a second MIS transistor having a second gate, a second source, and a second drain, the second source connected to the ground level and the first and second gates connected to each other;
   a current source having a current mirror circuit arrangement, the current source having terminals configured to supply currents to the first drain and the second drain respectively, one of the terminals connected to the second drain;
   a third MIS transistor having a third gate, a third source, and a third drain, the third MIS transistor configured to control the first current amplifier transconductance, the third source connected to the first drain and the third drain connected to another of the terminals of the current source;
   an input current terminal connected to the first drain and the first gate; and
   an output current terminal connected to the second drain.

5. The active filter circuit according to claim 1, wherein the second current amplifier comprises a current noninverting circuit.

6. The active filter circuit according to claim 5, wherein the current noninverting circuit includes:
   a first MIS transistor having a first gate, a first source, and a first drain, the first source connected to a ground level;
   an input current terminal connected to the first gate;
   a second MIS transistor having a second gate, a second source, and a second drain, the second source connected to the ground level and the second gate connected to the first drain;
   a current source comprising a current mirror circuit arrangement, the current source having terminals configured to supply currents to the first drain and the second drain respectively, one of the terminals connected to the second drain;
   a third MIS transistor having a third gate, a third source, and a third drain, the third MIS transistor configured to control the second current amplifier transconductance, the third source connected to the first drain and the third drain connected to another of the terminals of the current source; and
   an output current terminal connected to the second drain.

7. An active filter circuit comprising:
   a first current amplifier comprising a first MIS transistor circuit arrangement, the first current amplifier including a first input terminal, a first output terminal, and at least one first control terminal configured to control a first current amplifier transconductance;
   a first capacitor having one first capacitor electrode connected to the first input terminal of the first current amplifier;
   a second current amplifier comprising a second MIS transistor circuit arrangement, the second current amplifier including a second input terminal, a second output terminal, and at least one second control terminal configured to control a second current amplifier transconductance, the second input terminal connected to the first output terminal of the first current amplifier, and the second output terminal connected to the first input terminal of the first current amplifier;
   a second capacitor having one second capacitor electrode connected to a node between the first output terminal and the second input terminal; and
   an adder circuit comprising at least one MIS transistor and configured to add an input signal supplied to another first capacitor electrode and an output signal of the first current amplifier;
   wherein, when an input signal is input to the other first capacitor electrode, an output signal corresponding to the input signal filtered through one of a trap-pass filter and an all-pass filter is obtained from an output terminal of the filter circuit.

8. The active filter circuit according to claim 1, further comprising a third current amplifier comprising a third MIS transistor circuit arrangement, the third current amplifier including a third input terminal, a third output terminal, and at least one third control terminal configured to control a third current amplifier transconductance, the third input terminal and the third output terminal connected to the first output terminal of the first current amplifier.

9. The active filter circuit according to claim 8, wherein the third current amplifier comprises a current inverting circuit, the current inverting circuit including
   a first MIS transistor having a first gate, a first source, and a first drain, the first source connected to a ground level,
   an input current terminal connected to the first gate,
   a second MIS transistor having a second gate, a second source, and a second drain, the second source connected to the ground level,
   a current source having a current mirror circuit arrangement, the current source including terminals configured to supply currents to the first drain and the second drain respectively, one of the terminals connected to the first drain while another of the terminals connected to the second drain,
   a third MIS transistor having a third gate, a third source, and a third drain, the third MIS transistor configured to control the third current amplifier transconductance, the third source connected to the second gate,
   a voltage source connected to the third drain,
   a fourth MIS transistor having a fourth gate, a fourth source, and a fourth drain, the fourth source connected to the ground level, the fourth drain connected to the second gate, and the fourth gate connected to the input current terminal, and
   an output current terminal connected to the first drain.

10. The active filter circuit according to claim 8, further comprising a fourth current amplifier having a fourth MIS transistor circuit arrangement, the fourth current amplifier including a fourth input terminal, a fourth output terminal, and at least one fourth control terminal configured to control a fourth control terminal transconductance, the fourth output terminal connected to the second output terminal of the second current amplifier.

11. The active filter circuit according to claim 10, wherein the fourth current amplifier comprises a current noninverting circuit, the current noninverting circuit including a first MIS transistor having a first gate, a first source, and a first drain, the first source connected to a ground level, an input current terminal connected to the first gate, a second MIS transistor having a second gate, a second source, and a second drain, the second source connected to the ground level and the second gate connected to the first drain, a current source having a current mirror circuit arrangement, the current source having terminals configured to supply currents to the first drain and the second drain respectively, one of the terminals connected to the second drain, a third MIS transistor having a third gate, a third source, and a third drain, the third MIS transistor configured to control the fourth current amplifier transconductance, the third source connected to the first drain and the third drain connected to another of the terminals of the current source; and an output current terminal connected to the second drain.

12. The active filter circuit according to claim 7, wherein the second output terminal of the second current amplifier connected by a DC conductor to the first input terminal of the first current amplifier.

13. An active filter circuit comprising:

a first current amplifier comprising a first MIS transistor circuit arrangement, the first current amplifier including a first input terminal, a first output terminal, and at least one first control terminal configured to control a first current amplifier transconductance;

a first capacitor having one first capacitor electrode connected to the first input terminal of the first current amplifier;

a second current amplifier comprising a second MIS transistor circuit arrangement, the second current amplifier including a second input terminal, a second output terminal, and at least one second control terminal configured to control a second current amplifier transconductance, the second input terminal connected to the first output terminal of the first current amplifier, and the second output terminal connected to the first input terminal of the first current amplifier;

a second capacitor having one second capacitor electrode connected to a node between the first output terminal of the first current amplifier and the second input terminal of the second current amplifier;

a third current amplifier comprising a third MIS transistor circuit arrangement, the third current amplifier including a third input terminal, a third output terminal, and at least one third control terminal configured to control a third current amplifier transconductance, the third input terminal and the third output terminal connected to the first output terminal of the first current amplifier; and a fourth current amplifier comprising a fourth MIS transistor circuit arrangement, the fourth current amplifier including a fourth input terminal, a fourth output terminal, and at least one fourth control terminal configured to control a fourth current amplifier transconductance, the fourth output terminal connected to the second output terminal of the second current amplifier, wherein:

when a first input signal is input to the fourth input terminal of the fourth current amplifier, a first output signal filtered through a low-pass filter with respect to the first input signal is obtained from the output terminal of the first current amplifier;

when a second input signal is input to the other first capacitor electrode, a second output signal filtered through a band-pass filter with respect to the second input signal is obtained from the output terminal of the first current amplifier; and when a third input signal is input to the other second capacitor electrode, a third output signal filtered through a high-pass filter with respect to the third input signal is obtained from the output terminal of the first current amplifier.

14. The active filter circuit according to claim 13, wherein the first current amplifier, the second current amplifier, the third current amplifier, and the fourth current amplifier each include:

a first MIS transistor having a first gate, a first source, and a first drain, the first source connected to a ground level and the first gate supplied with an input signal;

a second MIS transistor having a second gate, a second source, and a second drain, the second source connected to the ground level and the second gate supplied with an inverted signal of the input signal; and an output circuit configured to output a difference between a current flowing through the first drain and a current flowing through the second drain.

15. The active filter circuit according to claim 14, wherein the output circuit comprises a current mirror circuit serving as a current source of the first and second MIS transistors, the current mirror circuit being shared amongst the first to fourth current amplifiers connected to one of the first and second capacitors.

16. The active filter circuit according to claim 14, wherein:

the output circuit comprises a current mirror circuit serving as a current source of the first and second MIS transistors, and the current mirror circuit being shared by the first and fourth current amplifiers connected to the first capacitor.

17. The active filter circuit according to claim 14, wherein the output circuit includes a current mirror circuit serving as a current source of the first and second MIS transistors, and the current mirror circuit being shared by the second and third current amplifiers connected to the second capacitor.

18. The active filter circuit according to claim 13, wherein the first current amplifier comprises a current noninverting circuit and the second current amplifier comprises a current inverting circuit.

19. The active filter circuit according to claim 13, wherein the first current amplifier comprises a current inverting circuit and the second current amplifier comprises a current noninverting circuit.

20. The active filter circuit according to claim 13, wherein the third current amplifier comprises a current inverting circuit.

21. The active filter circuit according to claim 13, further comprising a control voltage generation circuit configured to apply a control voltage to the first control terminal, the second control terminal, the third control terminal, and the fourth control terminal.

* * * * *